(12) United States Patent
Hsu et al.

(10) Patent No.: US 12,153,339 B2
(45) Date of Patent: Nov. 26, 2024

(54) NETWORK TYPE PELLICLE MEMBRANE AND METHOD FOR FORMING THE SAME

(71) Applicant: Taiwan Semiconductor Manufacturing Co., Ltd., Hsinchu (TW)

(72) Inventors: Pei-Cheng Hsu, Hsinchu (TW); Ta-Cheng Lien, Hsinchu (TW); Hsin-Chang Lee, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 514 days.

(21) Appl. No.: 17/390,603

(22) Filed: Jul. 30, 2021

(65) Prior Publication Data

US 2022/0244634 A1    Aug. 4, 2022

Related U.S. Application Data

(60) Provisional application No. 63/143,631, filed on Jan. 29, 2021.

(51) Int. Cl.
| | |
|---|---|
| *G03F 1/64* | (2012.01) |
| *B82Y 30/00* | (2011.01) |
| *B82Y 40/00* | (2011.01) |
| *G03F 1/82* | (2012.01) |
| *G03F 7/00* | (2006.01) |
| *H01L 21/033* | (2006.01) |

(52) U.S. Cl.
CPC ............... *G03F 1/64* (2013.01); *B82Y 30/00* (2013.01); *B82Y 40/00* (2013.01); *G03F 1/82* (2013.01); *G03F 7/70983* (2013.01); *H01L 21/0332* (2013.01); *H01L 21/0337* (2013.01)

(58) Field of Classification Search
CPC ..................................... G03F 1/62; G03F 1/64
See application file for complete search history.

(56) References Cited

U.S. PATENT DOCUMENTS

| | | | |
|---|---|---|---|
| 2017/0176850 A1* | 6/2017 | Chen | H01L 21/0274 |
| 2018/0329289 A1* | 11/2018 | Gallagher | G03F 1/62 |
| 2018/0329291 A1* | 11/2018 | Timmermans | G03F 1/64 |
| 2019/0033704 A1* | 1/2019 | Jeong | G03F 7/70008 |
| 2020/0201169 A1* | 6/2020 | Mariano Juste | G03F 1/62 |
| 2020/0272047 A1 | 8/2020 | Chatterjee et al. | |
| 2021/0132490 A1* | 5/2021 | Lin | G03F 7/70983 |

(Continued)

FOREIGN PATENT DOCUMENTS

| | | | | |
|---|---|---|---|---|
| DE | 102020115130 A1 | 6/2021 | | |
| JP | 2006028013 A * | 2/2006 | ............ | B82Y 30/00 |

(Continued)

*Primary Examiner* — Martin J Angebrandt
(74) *Attorney, Agent, or Firm* — Seed IP Law Group LLP (57) ABSTRACT

A pellicle for protecting a photomask from contaminant particles is provided. The pellicle includes a pellicle membrane containing at least one porous film. The at least one porous film includes a network of a plurality of nanotubes. At least one nanotube of the plurality of nanotubes includes a core nanotube and a shell nanotube surrounding the core nanotube. The core nanotube includes a material different from the shell nanotube. The pellicle further includes a pellicle border attached to the pellicle membrane along a peripheral region of the pellicle membrane and a pellicle frame attached to the pellicle border.

20 Claims, 10 Drawing Sheets

(56) References Cited

U.S. PATENT DOCUMENTS

| | | | | |
|---|---|---|---|---|
| 2021/0191255 A1* | 6/2021 | Timmermans | ...... | G03F 7/70983 |
| 2023/0044415 A1* | 2/2023 | Chao | ............ | H01L 21/0337 |
| 2023/0205073 A1* | 6/2023 | Chao | ............ | G03F 1/24 |
| | | | | 430/5 |
| 2023/0236496 A1* | 7/2023 | Hsu | ............ | G03F 1/62 |
| | | | | 430/5 |
| 2023/0259021 A1* | 8/2023 | Chao | ............ | G03F 1/62 |
| | | | | 430/5 |
| 2023/0324814 A1* | 10/2023 | Huang | ............ | G03F 7/70033 |
| | | | | 430/270.1 |

FOREIGN PATENT DOCUMENTS

| | | | | |
|---|---|---|---|---|
| KR | 10-2019-0018608 A | 2/2019 | | |
| KR | 10-2020-0071080 A | 6/2020 | | |
| WO | WO 2014142125 A1 | 9/2014 | | |
| WO | WO 2015160185 A1 | 10/2015 | | |
| WO | WO-2018008594 A1 * | 1/2018 | ............ | C01B 32/159 |
| WO | WO 2019176410 A1 | 9/2019 | | |
| WO | WO-2021037662 A1 * | 3/2021 | ............ | C01B 32/158 |
| WO | WO-2021172104 A1 * | 9/2021 | ............ | C01B 32/16 |

* cited by examiner

Fig. 6

NETWORK TYPE PELLICLE MEMBRANE AND METHOD FOR FORMING THE SAME

PRIORITY CLAIM AND CROSS-REFERENCE

This application claims the benefit of U.S. Provisional Patent Application No. 63/143,631, filed Jan. 29, 2021, which is incorporated by reference herein in its entirety.

BACKGROUND

In the semiconductor integrated circuit (IC) industry, technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing.

In a process of manufacturing the IC devices, a lithography process is employed to form a circuit pattern on a wafer. In the lithography process, a photomask is used to transfer a desired pattern onto the wafer. When the photomask is contaminated with foreign materials, such as particles, from the ambient environment, defects may occur on the wafer to which the pattern of the photomask is transferred.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In semiconductor fabrication, various lithographic processes are extensively used in the course of defining devices and circuit patterns. Depending on the size of the features to be defined, different optical lithographic processes may be used. In a lithographic process, a pattern present on a photomask or reticle may be transferred to a light-sensitive photoresist coating by illuminating the photomask. The light is modulated by the reticle pattern and imaged onto a photoresist-coated wafer. In general, as the patterns become smaller, shorter wavelength are utilized. In extreme ultra-violet (EUV) lithography, a wavelength of about 13.5 nm is frequently used to produce feature sizes of less than 32 nanometers.

A pellicle including a pellicle membrane is commonly placed above the patterned side of the photomask with a gap to protect the photomask from contamination during handling and exposure. The pellicle thus protects the photomask from unwanted particles which otherwise could negatively impact the fidelity of the pattern transfer to the wafer. As the pellicle membrane remains covering the photomask during exposure, there are stringent requirements for the pellicle membrane in terms of absorption, durability, and particle shielding capability, etc.

When it comes to EUV lithography, it has been challenging to find suitable pellicle membrane materials that have high transmission and stability at EUV wavelengths. In EUV lithography, pellicle membrane damages occur due to heat generated by the EUV exposure and hydrogen plasma. Such pellicle membrane damages may shorten the lifespan of the pellicle.

Embodiments of the present disclosure provide a pellicle membrane having improved chemical and thermal stabilities to EUV light. The pellicle membrane is formed of a network of a plurality of heterostructure nanotubes. The nanotube has a core-shell structure including a carbon nanotube as the core and a boron nitride nanotube as the shell. The boron nitride has higher chemical and thermal stabilities than the carbon, and thus helps to prevent damages of the carbon nanotube core by EUV exposure and hydrogen flow. As a result, the reliability and lifespan of the pellicle membrane are improved.

Figure 1:
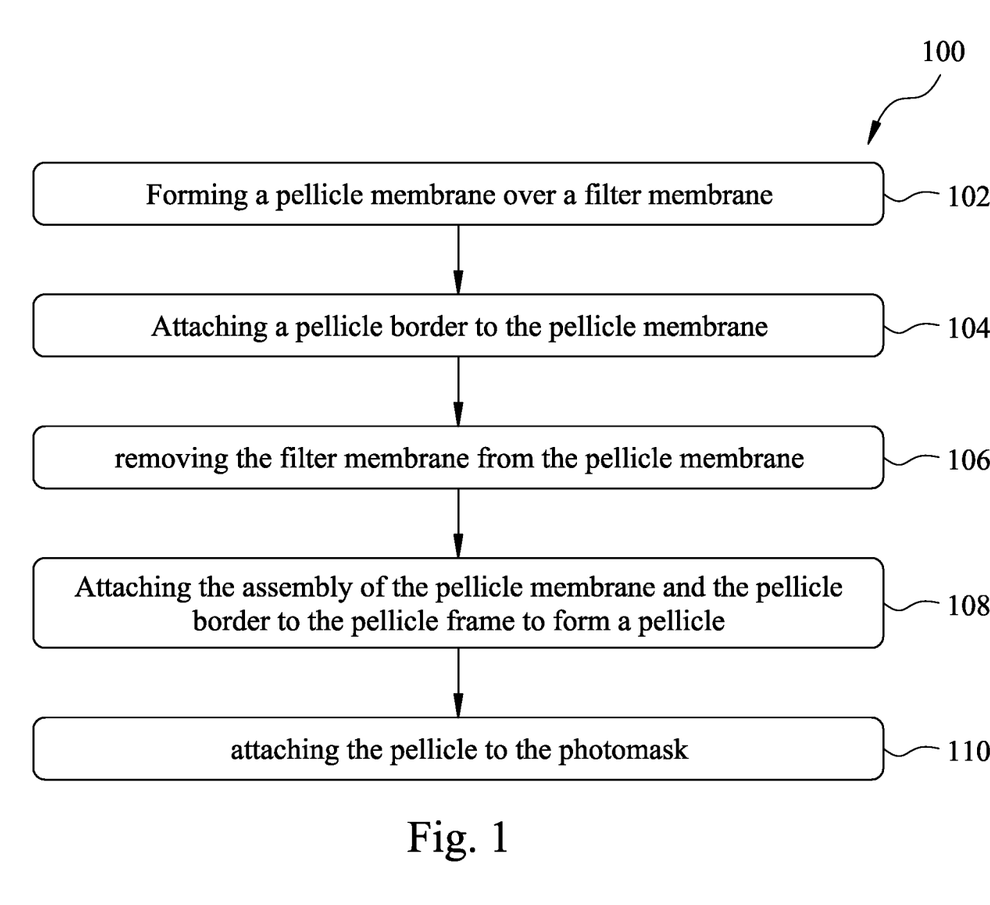
FIG. 1 is a flowchart of a method of fabricating a mask pellicle system, in accordance with some embodiments

FIG. 1 is a flowchart of a method 100 for fabricating a mask pellicle structure, in accordance with some embodiments of the present disclosure. FIGS. 2A-2E are cross-sectional views of a mask pellicle system 200 fabricated according to one or more steps of the method 100 of FIG. 1. It is understood that additional steps can be provided before, during, and after the method 100, and some of the steps described below can be replaced or eliminated, for additional embodiments of the method. It is further understood that additional features can be added in the pellicle-mask structure, and some of the features described below can be replaced or eliminated, for additional embodiments of the semiconductor structure.

Figure 2A:
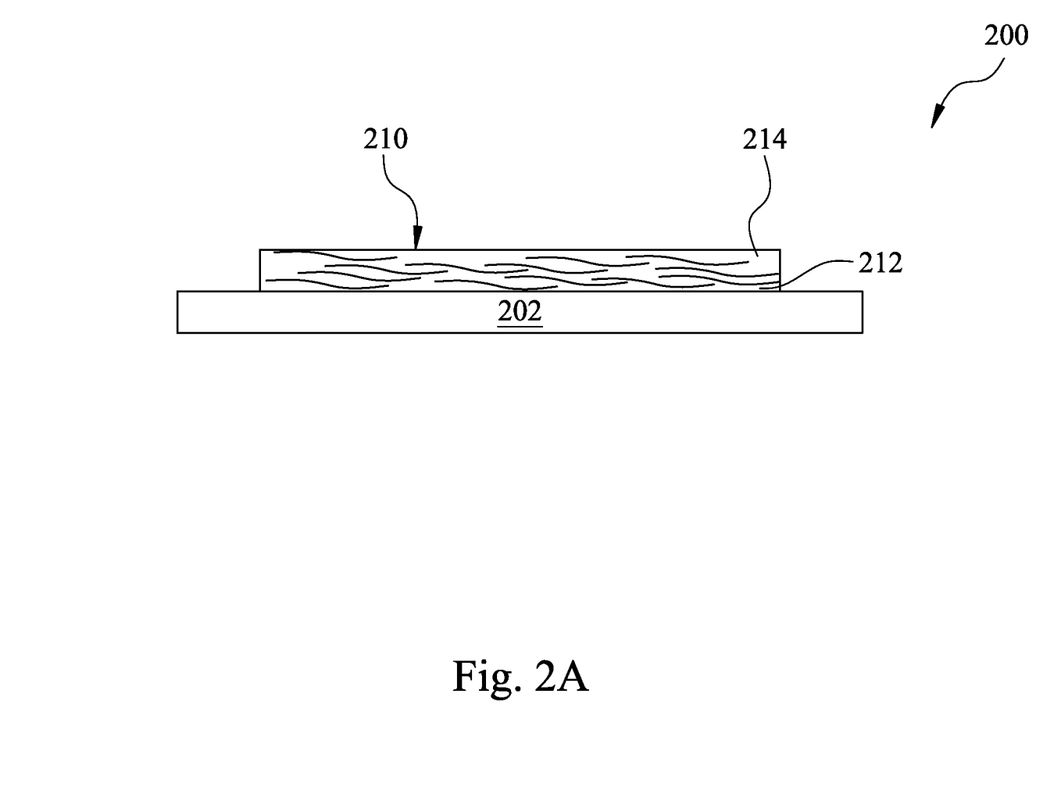
FIGS. 2A-2E are cross-sectional views of various stages of forming a mask pellicle system, in accordance with some embodiments.

Referring to FIG. 1 and FIG. 2A, the method 100 includes operation 102, in which a pellicle membrane 210 is formed over a filter membrane 202, in accordance with some embodiments. FIG. 2A is a cross-sectional view of a mask pellicle system 200 after forming the pellicle membrane 210 over the filter membrane 202, in accordance with some embodiments.

Referring to FIG. 2A, a filter membrane 202 is provided. The filter membrane 202 is a porous membrane. In some embodiment, the filter membrane 202 has pores between about 0.1 μm to about 5 μm in diameter. In one example, the pore size is from about 0.1 μm to about 2 μm. In another example, the pore size is about 0.45 μm. In some embodiments, the filter membrane 202 is formed of or coated with polyethylene terephthalate (PET). In some embodiments, the filter membrane 202 is formed of or coated with other suitable materials such as nylon, cellulous, polymethylmethacrylate (PMMA), polystyrene (PS), polytetrafluoroethylene (PTFE), or polybenzoxazole (PBO). In some embodiments, the filter membrane 202 is formed of a cellulose-based filter paper. In some embodiments, the filter membrane 202 is a hydrophilic membrane. In some other embodiments, the filter membrane 202 is a hydrophobic membrane.

The pellicle membrane 210 is adapted to prevent contaminant particles from landing on a photomask, e.g., photomask 250 (FIG. 2E), and degrading the result of photolithography process (e.g., by keeping contaminant particles away from a focus plane of the photomask).

The pellicle membrane 210 is transparent to the radiation beam used in a lithography patterning process. In some embodiments, the pellicle membrane 210 is transparent to UV light. In some embodiments, the pellicle membrane 210 is transparent to EUV light. The thickness of the pellicle membrane 210 is set to provide the membrane with sufficient strength to withstand the pressure created by the collisions of contaminant particles with the membrane without degrading the membrane. In some embodiments, the pellicle membrane 210 may have a thickness ranging from about 5 nm to 50 nm. The thickness of the pellicle membrane 210 may be greater depending on the porosity of the pellicle membrane 210.

The pellicle membrane 210 is a porous membrane including a single or multiple porous thin films 212. Each of the porous thin films 212 includes a network of nanotubes 214 arranged across one another. The individual nanotubes 214 are arranged randomly within the porous thin film 212 such that the nanotubes 214 are not arranged within the porous thin film 212 along a major or predominant direction. However, the nanotubes 214 of the porous thin film 212 may be provided in an ordered manner. The nanotubes 214 may for example be provided along a major direction or a plurality of major directions.

The nanotubes 214 may also be bundled within the porous thin film 212 such that a plurality of individual nanotubes 214 form a bundle (i.e., a string or rope-like structure). As a result, the porous thin film 212 includes a network of a plurality of bundles of nanotubes 214. A nanotube bundle may include, for example, 2-20 individual nanotubes 214. In a nanotube bundle, individual nanotubes 214 may be aligned and joined along their longitudinal directions. Nanotubes 214 of a bundle may also be joined end-to-end such that the length of the nanotube bundle is greater than the length of the individual nanotubes. The nanotubes 214 may typically be joined by van der Waals forces.

The porous thin film 212 has a relative low density due to the presence of open area in the network of nanotubes 214. In some embodiments, the porous thin film 212 may have a density ranging from about 0.01 g/cm$^3$ to about 2 g/cm$^3$. If the density of the porous thin film 212 is too low, the large open area in the porous thin film 212 may cause particle penetration to the photomask, which leads to critical dimension (CD) error in the resist pattern, in some instances. If the density of the porous thin film 212 is too high, the transmission of the EUV light is likely hindered, in some instances. To prevent the particle penetration, in some embodiments, the pellicle membrane 210 may include a plurality of porous thin films 212 arranged on top of each other in a stacked manner to decrease the opening area. Since nanotubes in a low density porous film are subjected to bundle vibration under vacuum, which is deemed to be a particle source in EUV lithography. Stacking low density porous films also helps to reduce bundle vibration, and thus prevents formation of contaminant particles.

The nanotubes 214 may have various cross-sectional sectional shapes, for example, including but not limited to, a circular cross-sectional shape, an elliptical cross-sectional shape, or a polygonal cross-sectional shape. In some embodiments, the nanotubes 214 may have a heterostructure including at least two different kinds of materials.

Figure 3:
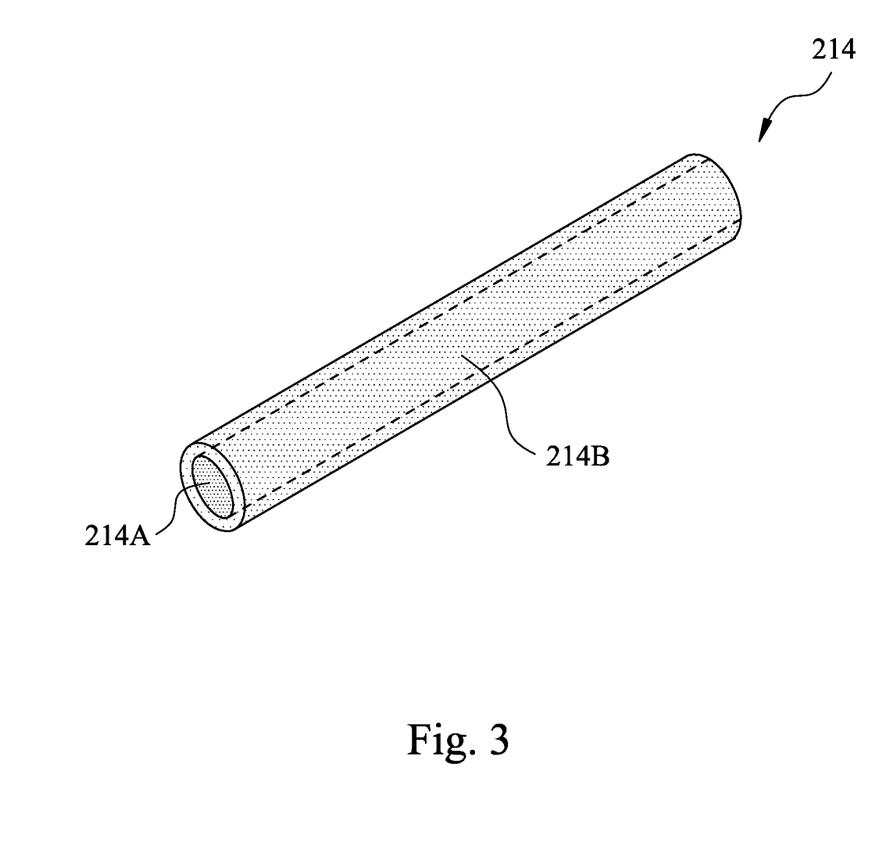
FIG. 3 is a schematic perspective view of a nanotube, in accordance with some embodiments.

FIG. 3 is a schematic perspective view of a heterostructure nanotube 214, in accordance with some embodiments. In some embodiments and as shown in FIG. 3, the nanotube 214 has a core-shell structure including a nanotube core 214A of a first material and a nanotube shell 214B of a second material surrounding the nanotube core 214A. The core material (i.e., first material) is transparent to EUV light. In some embodiments, the nanotube core 214A is formed of a carbon nanotube, including both single wall carbon nanotube (SWCNT) and multiwall carbon nanotube (MWCNT). In some embodiments, the SWCNT core may have a dimeter of about 0.5 nm to about 2 nm. In some embodiments, the MWCNT core may have a diameter of about 5 nm to about 30 nm. In some embodiments, the nanotube core 214A has a length from about 1 μm to about 10 mm.

The nanotube shell 214B includes a material having high resistance to oxidation and chemicals. The nanotube shell 214B thus helps to protect the nanotube core 214A from the attack by UV or EUV light and ionized gases that come in contact with the nanotube shell 214B, e.g., H+ gas. The nanotube shell 214B also serves as a thermal conductive layer which promotes the transfer of the thermal energy from the nanotube core 214A to the environment around the pellicle membrane 210. In some embodiments, the nanotube shell 214B includes a low extinction coefficient material to ensure sufficient transmission of UV or EUV light. In some embodiments, the shell material (i.e., second material) may have an extinction coefficient less than or equal to 0.02. In some embodiments, the shell material allows for the transmission of 80% or more, 85% or more, 90% or more, 95% or more of the radiation to the photomask. In some embodiments, the nanotube shell 214B may include boron nitride (BN), boron (B), boron carbide ($B_4C$), boron carbon nitride (BCN), silicon nitride (SiN), silicon carbide (SiC), silicon boron nitride (SiBN), or silicon boron carbide (BC). In some embodiments, the nanotube shell 214B is formed of a single wall boron nitride nanotube (BNNT). In some other embodiments, the nanotube shell 214B is formed of a multiwall BNNT. The thickness of the nanotube shell 214B is controlled so that the nanotube shell 214B does not degrade the transparence of the pellicle membrane 210 to UV or EUV light while providing a reliable protection to the nanotube core 214A. In some embodiments, the nanotube shell 214B may have a thickness ranging from about 1 nm to about 10 nm. If the thickness of the nanotube shell 214B is too small, sufficient protection to the nanotube core 214A from attack by UV or EUV radiation or chemicals is not sufficient, in some instances. If the thickness of the nanotube shell 214B is too great, the transparence of the pellicle membrane 210 is degraded, in some instances. In some embodiments, the nanotube shell 214B has a thickness of 5 nm with a variation of 10% or less.

In some embodiments, the nanotubes 214 may be formed by growth of one or more nanotubes of a first material inside of a nanotube template of a second material. The nanotube template of the second material acts as an encapsulating shell in which the confined second material can be restructured into at least one nanotube of the first material. The dimension of the nanotube core 214A thus is restricted by the dimension of the nanotube shell 214B. In some embodiments, the nanotube shell 214B is formed by plasma arc discharge, laser vaporization, ball-milling, laser ablation, or thermal plasma jet. The coalescence of molecules of the first material into the nanotube core inside the nanotube shell 214B may be achieved by electron beam irradiation or heat treatment.

In some embodiments, the nanotubes 214 may alternatively be formed by coating a nanotube core 214A with a shell material. In some embodiments, the nanotube core 214A may be formed by plasma arc discharge, laser vaporization, ball-milling, laser ablation, or thermal plasma jet. The deposition of the shell material that provides the nanotube shell 214B may be performed using a deposition process such as, for example, ion beam deposition, chemical vapor deposition (CVD), plasma enhanced chemical vapor deposition (PECVD), physical vapor deposition (PVD), or atomic layer deposition (ALD). During the deposition, the stage may be rotated or titled to ensure conformal and uniform deposition of the shell material onto the nanotube core 214A. In some embodiments and when the nanotube shell 214B includes BN, the BN shell can be formed by CVD by flowing boron (e.g., boron oxide $B_2O_3$ or boric acid $H_3BO_3$) and nitrogen (e.g., nitrogen $N_2$, ammonia $NH_3$, or urea $CO(NH_2)_2$) precursors into a reaction chamber. In some other embodiments, the BN shell can be formed by CVD by flowing boron trihalides (boron trichloride $BCl_3$ or boron trifluoride $BF_3$) with $N_2$ or $NH_3$, diborane $B_2H_6$ with $NH_3$, and single source precursors such as borazine $B_3H_6N_3$ or ammonia borane $H_3NBH_3$. In some embodiments, the CVD may be performed at a temperature ranging from about 500° C. to about 1200° C.

In some embodiments, the porous thin film 212 may be formed by first forming a suspension of nanotubes 214 in a liquid medium. In some embodiments, the suspension is formed by adding nanotubes 214 into the liquid medium under mixing conditions. The mixture is then sonicated to ensure the nanotubes 214 are well dispersed in the liquid medium. The liquid medium is a non-solvent liquid medium that is non-reactive with the nanotubes 214 and in which the nanotubes 214 are virtually insoluble. The liquid medium also has a low boiling point so that the liquid medium can be easily and quickly removed, facilitating drying of the continuous nanotube network subsequently formed. Examples of suitable non-solvent liquid medium that can be used to make the nanotube suspension include, but are not limited to, water, volatile organic liquids such as acetone, ethanol, methanol, n-hexane, ether, acetonitrile, chloroform, DMF, and mixtures thereof. In some embodiments, the suspension is formed by dispersing nanotubes 214 into water.

In some embodiments, the suspension may also include a surfactant to maintain the suspension and/or other chemical agents to facilitate nanotube network formation or dewatering. For example, Triton X-100 and dodecylbenzenesulfonic acid sodium salt may be used. However, sometimes, a surfactant may not be needed if the nanotube 214 can form a stable suspension in the liquid medium without it.

The concentration of nanotubes 214 in the suspension is controlled to facilitate dispersion and minimize agglomeration of nanotubes 214. In some embodiments, the concentration of nanotubes 214 in the suspension is less than 500 mg/L. In some embodiments, the concentration of nanotubes 214 in the suspension is from about 25 mg/L to about 150 mg/L. In some embodiments, the concentration of nanotubes 214 in the suspension is from about 40 mg/L to about 100 mg/L.

Next, the suspension of nanotubes 214 is applied to the surface of the filter membrane 202, for example, by spin coating or dip coating. The suspension is filtered by the filter membrane 202 to remove the liquid medium, leaving a layer of continuous nanotubes 214 on the filter membrane 202. The layer of continuous nanotubes 214 constitutes a single layer of porous thin film 212. In some embodiment, the filtration step is conducted with the aid of vacuum to pull the liquid medium through the filter membrane 202. The amount of vacuum used depends on factors such as the porosity of the filter membrane 202, the viscosity of the liquid medium, speed of movement of the filter membrane 202, and the concentration of nanotubes 214 in the suspension. All of these parameters can be manipulated to achieve the desired characteristics of the nanotube network, including the thickness and porosity of the continuous network. The as-deposited porous thin film 212 may subsequently be cleaned using a cleaning solvent to remove any contaminants thereon. Suitable cleaning solvents includes, but are not limited to, water and alcohol such as ethanol. In some embodiments, the suspension application, filtration and cleaning processes may be repeated several times to form a stack of porous thin films 212 to decrease the open area in the resulting pellicle membrane 210.

Figure 2B:
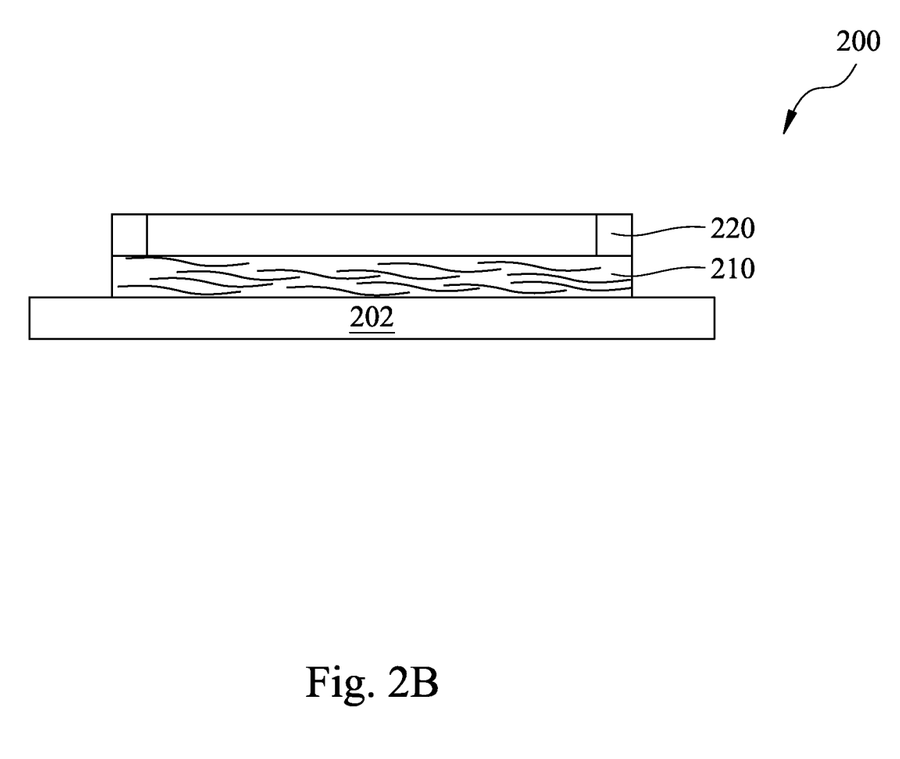

Referring to FIGS. 1 and 2B, the method proceeds to operation 104, in which a pellicle border 220 is attached to the pellicle membrane 210, in accordance with some embodiments. FIG. 2B is a cross-sectional view of the mask pellicle system 200 of FIG. 2A after attaching the pellicle border 220 to the pellicle membrane 210, in accordance with some embodiments.

Referring to FIG. 2B, the pellicle border 220 is attached along a peripheral portion of the pellicle membrane 210. In some embodiments, the pellicle border 220 is made of silicon, silicon carbide, silicon nitride, silicon dioxide, silicon oxynitride, $Al_2O_3$, Ti, or combinations thereof. To attach the pellicle border 220 to the pellicle membrane 210, in some embodiments, the pellicle border 220 is first brought into physical contact with the pellicle membrane 210. The pellicle border 220 is then pressed against the pellicle membrane 210 to fix the pellicle border 220 to the pellicle membrane 210 given that a sufficient force is used. In some embodiments, the pellicle border 220 and the pellicle membrane 210 are held together by van der Waals forces. In some embodiments, to ensure a better adhesion, an adhesive is used to the pellicle border 220 to the pellicle membrane 210. The adhesive needs to be low outgassing to avoid material deposition on mask surface. In some embodiments, the outgas amount of the low outgassing adhesive exhibits the result of TML being 1.0 or lower when tested in accordance with the method specified by ASTM E595-93. Herein, TML is the total mass loss as defined in ASTM E595-93.

Figure 2C:
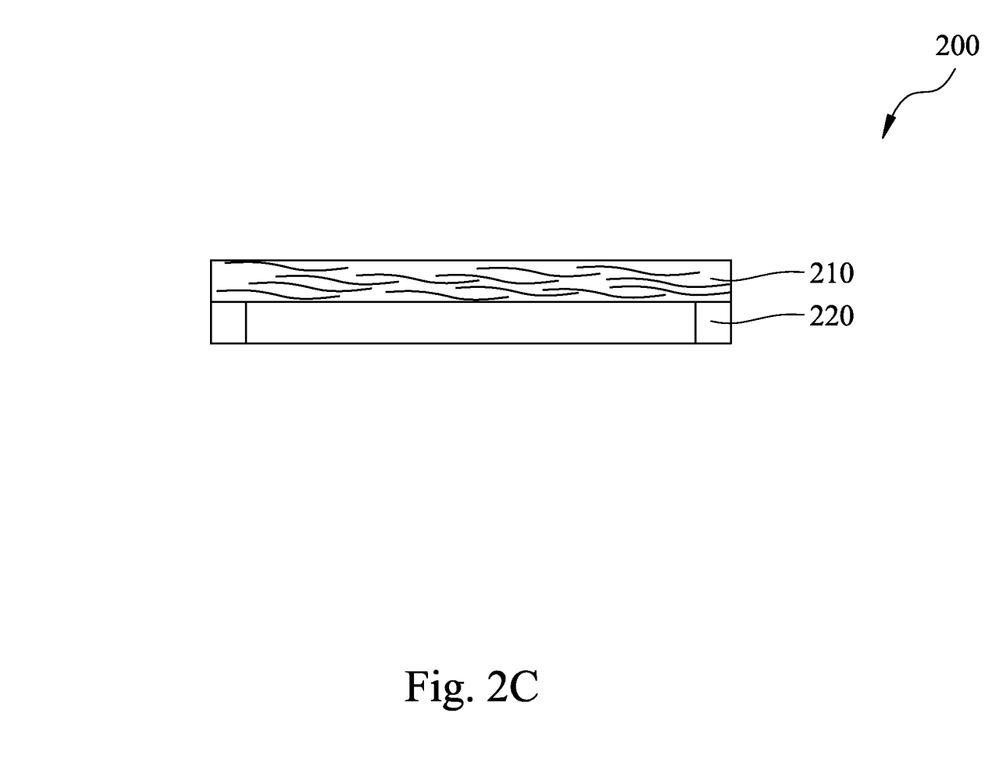

Referring to FIGS. 1 and 2C, the method proceeds to operation 106, in which the filter membrane 202 is removed from the pellicle membrane 210, in accordance with some embodiments. FIG. 2C is a cross-sectional view of the mask pellicle system 200 of FIG. 2B after removing the filter membrane 202 from the pellicle membrane 210, in accordance with some embodiments.

Referring to FIG. 2C, the assembly of the pellicle membrane 210 and the filter membrane 202 shown in FIG. 2B is flipped upside down so that the filter membrane 202 is positioned on top of the pellicle membrane 210. Subsequently, the filter membrane 202 is removed from the pellicle membrane 210. In some embodiments, the filter membrane 202 may be removed by peeling or pulling the filter membrane 202 away from the pellicle membrane 210. As shown in FIG. 2C, after removal of the carrier 20, the pellicle membrane 210 is supported by the pellicle border 220 along the peripheral portion of the pellicle membrane 210.

Figure 2D:
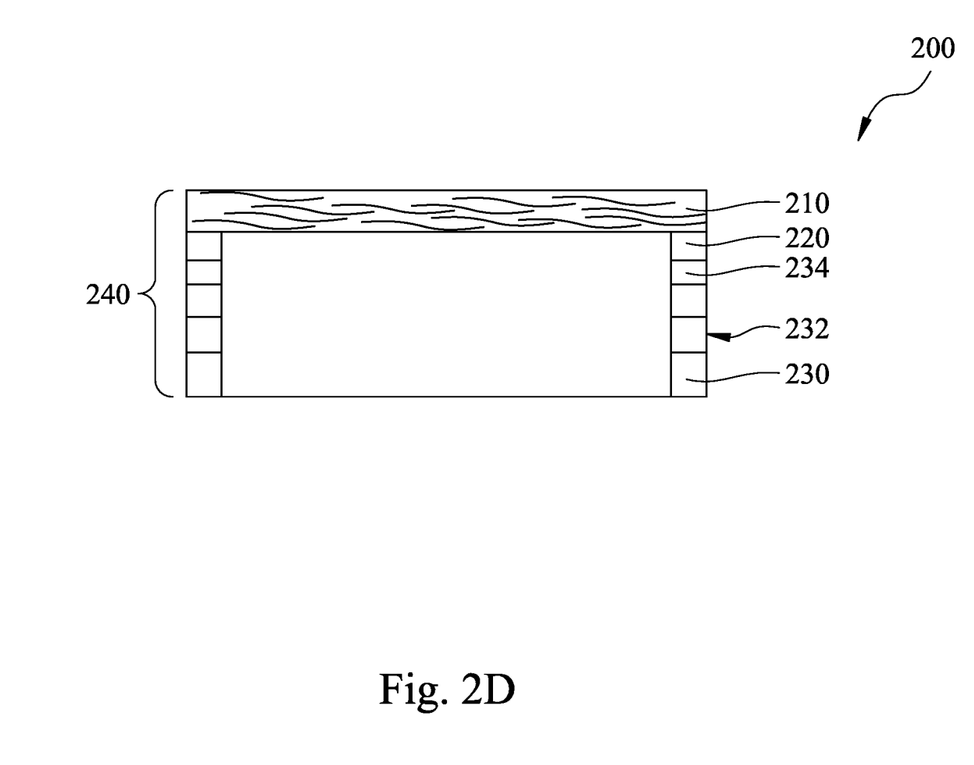

Referring to FIGS. 1 and 2D, the method proceeds to operation 108, in which an assembly of the pellicle membrane 210 and the pellicle border 220 is attached to a pellicle frame 230, in accordance with some embodiments. FIG. 2D is a cross-sectional view of the mask pellicle system 200 of FIG. 2C after attaching the assembly of the pellicle membrane 210 and the pellicle border 220 to the pellicle frame 230, in accordance with some embodiments.

Figure 2E:
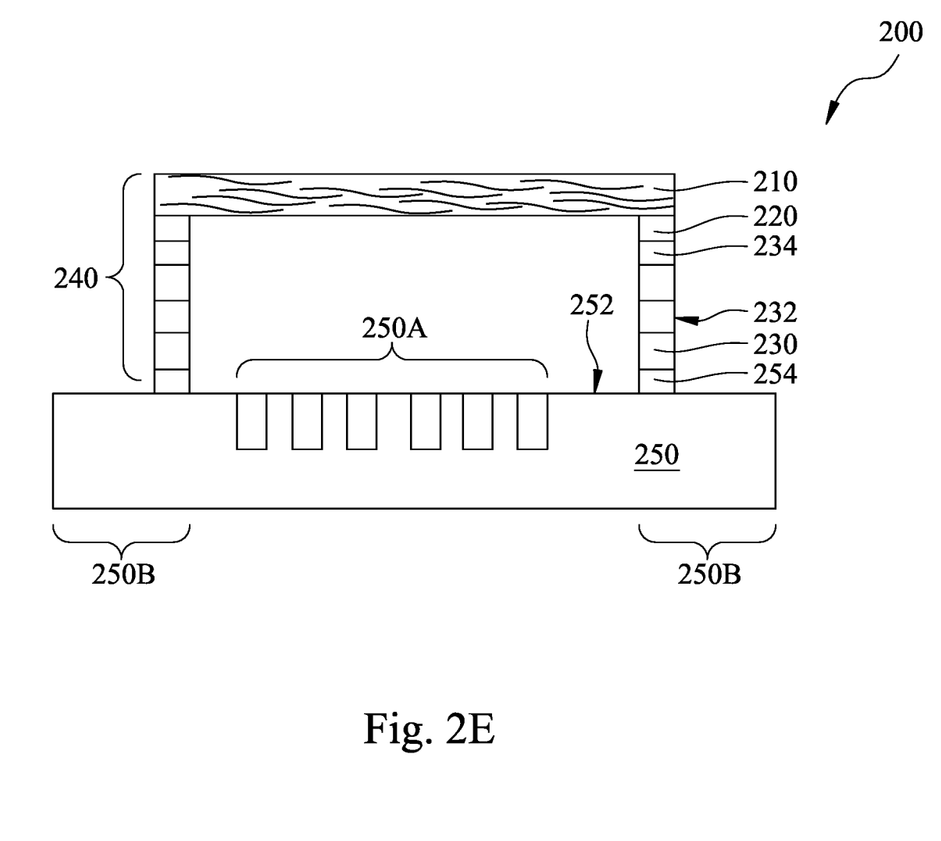

Referring to FIG. 2D, the pellicle frame 230 is configured to properly secure the pellicle membrane 210 to the photomask 250 (FIG. 2E). The pellicle frame 230 may be designed in various dimensions, shapes, and configurations. In some embodiments, the pellicle frame 230 may have a round shape, a rectangular shape, or any other suitable shape.

The pellicle frame 230 may include a rigid material with a sufficient mechanical strength, and designed in a shape, dimension, and a configuration so as to secure the pellicle membrane 210 properly across the pellicle frame 230. In some embodiments, the pellicle frame 230 may include a porous material. Exemplary materials that can be used in the pellicle frame 230 include, but are not limited to, anodized alumina formed using aluminum (Al), Al-alloy, titanium (Ti), nickel (Ni), gold (Au), silver (Ag), copper (Cu), molybdenum (Mo), platinum (Pt), chromium (Cr), manganese (Mn), iron (Fe), cobalt (Co), palladium (Pd), tantalum (Ta), tungsten (W), silicon, polymer, other suitable material, and/or combinations thereof. In some embodiments, the pellicle frame 230 may include a frame material with a coefficient of thermal expansion (CTE) determined according to the design specifications. In some embodiments, the pellicle frame 230 is formed of an Al—Ti alloy.

Figure 4:
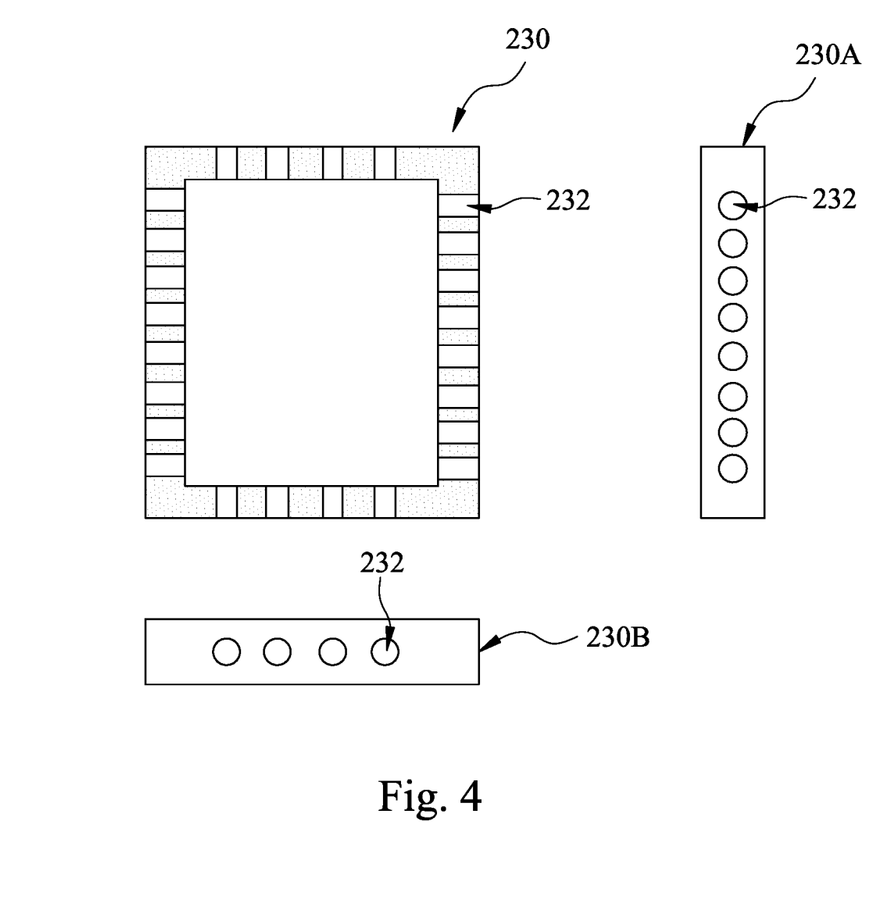
FIG. 4 is an illustration of a pellicle frame by a cross-sectional view and a side view, in accordance with some embodiments.

In some embodiments, the pellicle frame 230 may include a plurality of vent holes 232. The vent holes 232 are formed to accommodate air pressure equivalent. FIG. 4 is an illustration of the pellicle frame 230 by a cross-sectional view and a side view, in accordance with some embodiments. The vent holes 232 are provided on the longer side members 230A of the pellicle frame 230 as well as on the shorter side members 230B of the pellicle frame 230. Because the pellicle membrane 210 is formed of a porous thin film 212 which can help to achieve the air pressure equivalent, in some embodiments, the vent holes 232 in the pellicle frames 230 are not needed.

The pellicle frame 230 has a height selected to position the pellicle membrane 210 out of focus of incident radiation passing through the pellicle membrane 210 to the photomask 250. In some embodiments, the height of the pellicle frame 230 is in the range from about 1 mm to about 10 mm. If the height is too small, a risk for imaging particles and other contaminants residing on the pellicle membrane 210 increases, in some instances. If the height is too great, a weight of pellicle is needlessly increased, in some instances.

The assembly of the pellicle membrane 210 and the pellicle border is attached to the pellicle frame 230 via the pellicle border 220 so that the pellicle membrane 210 is stretched over the pellicle frame 230. In some embodiments, the pellicle border 220 is attached to the pellicle frame 230 by a frame adhesive 234. In some embodiments, the frame adhesive 234 includes a thermosetting adhesive material such as, for example, epoxy resin, acrylic resin, fluorine resin, benzocyclobutene (BCB), methylsilsesquioxane (MSQ), polyimide, other thermosetting materials, and/or combinations thereof. In some embodiments, the frame adhesive 234 includes a glue or another material configured to secure pellicle border 220 to pellicle frame 230.

A pellicle 240 is thus formed. The pellicle 240 includes a pellicle frame 230 and a pellicle membrane 210 attached to the pellicle frame 230 via the pellicle border 220. The pellicle 240 helps to prevent the particles from reaching photomask 250 and interfering with the pattern transfer.

Referring to FIGS. 1 and 2E, the method proceeds to operation 110, in which the pellicle 240 is attached to a photomask 250, in accordance with some embodiments. FIG. 2E is a cross-sectional view of the mask pellicle system 200 of FIG. 2D after attaching the pellicle 240 to the photomask 250, in accordance with some embodiments.

Referring to FIG. 2E, the pellicle 240 is mounted onto a border region of the photomask 250. In some embodiments, the pellicle frame 230 is attached to a border region 250B at a front side surface 252 of the photomask 250 using a pellicle adhesive 254. The pellicle adhesive 254 may include a material the same as, or different from, the frame adhesive 234. For example, in some embodiments, the pellicle adhesive 254 may include a thermosetting adhesive material such as, for example, epoxy resin, acrylic resin, fluorine resin, BCB, MSQ, or polyimide. In some other embodiments, the pellicle frame 230 may be secured to the photomask 250 in a manner other than the pellicle adhesive 254, such as at least one suction cup, a vacuum, or an electrostatic sticker. In such embodiments, the pellicle adhesive 254 is omitted.

The photomask 250 includes a pattern region 250A usable to transfer patterns onto a semiconductor wafer by photolithography. The pellicle membrane 210 extends over the pattern region 250A of the photomask 250 to protect the pattern region 250A from contaminant particles. Particles unintentionally deposited on the pattern region 250A introduce defects and result in degradation of the transferred patterns. Particles may be introduced by any of a variety of ways, such as during, a cleaning process, and/or during handling of the photomask 250. By keeping the contaminant particles out of the focal plane of the photomask 250, a high fidelity pattern transfer from the pattern region 250A to the semiconductor wafer can be achieved.

Figure 5:
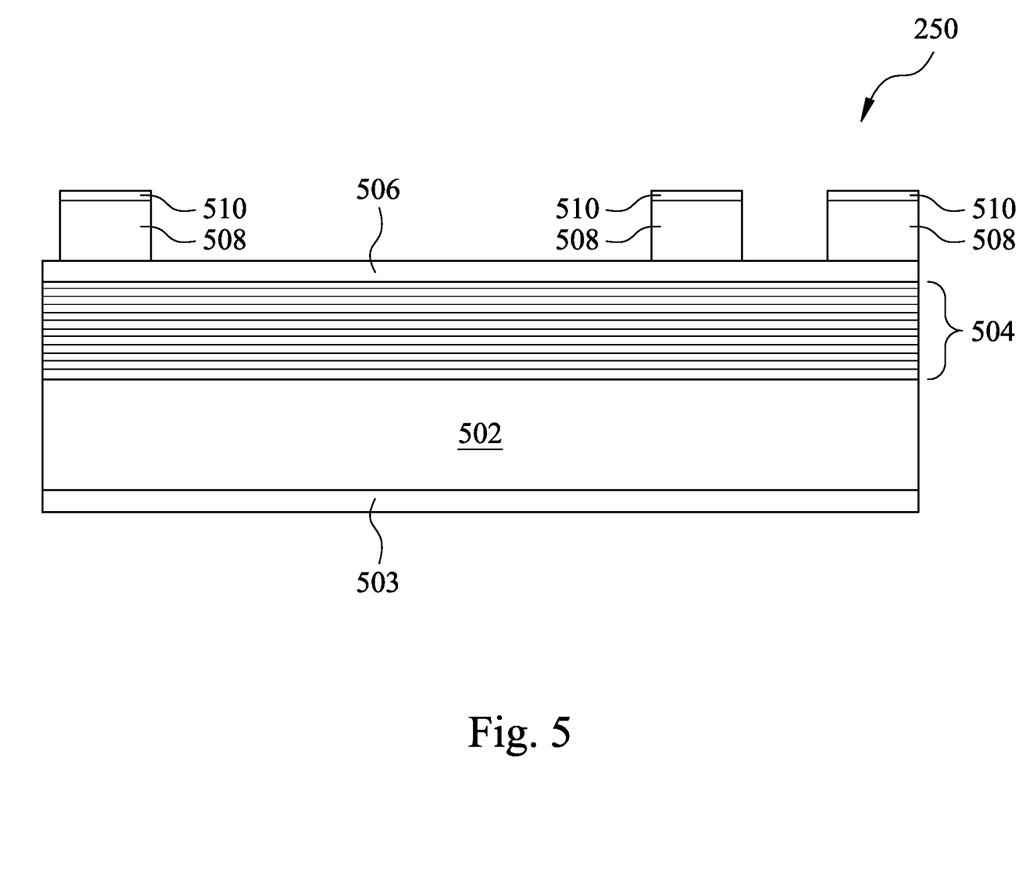
FIG. 5 is a cross-sectional view of a photomask, in accordance with some embodiments.

FIG. 5 illustrates an exemplary photomask 250 that can be used in EUV photolithography, in accordance with some embodiments. As shown in FIG. 5, in some embodiments, the photomask 250 may include a substrate 502 having a backside coating layer 503, a multi-layer structure 504, a capping layer 506, and one or more absorbers 508 having an anti-reflective coating (ARC) layer 510.

In some embodiments, the substrate 502 includes a low thermal expansion (LTE) glass, fused quartz, silicon carbide, carbonado or another appropriate material. In some embodiments, the substrate 502 has a thickness ranging from about 6.3 mm to about 6.5 mm. If the thickness is too small, a risk of breakage or warping increases, in some instances. If the thickness is too great, a weight of photomask 250 is needlessly increased, in some instances.

In some embodiments, the backside coating layer 503 includes a chromium nitride ($Cr_xN_y$), tantalum nitride (TaN), or tantalum boride (TaB). The thickness of the backside coating layer 503 helps to ensure reflection of incident radiation. If the thickness of the backside coating layer 503 is too small, a risk of radiation passing through the backside coating layer 503 increases, in some instances. If the thickness of the backside coating layer 530 is too great, material is wasted and production cost is increased without a significant increase in performance, in some instances. In some examples, the backside coating layer 503 has a thickness ranging from about 70 nm to about 100 nm.

The multi-layer structure 504 may include molybdenum-silicon (Mo—Si) multi-layers deposited on top of the substrate 502 for example, using an ion deposition technique. In some embodiments, the multi-layer structure 504 has a thickness ranging from about 250 nm to about 350 nm, and in some examples each Mo—Si layer pair has a thickness ranging from about 3 nm (for the Mo layer) and about 4 nm (for the Si layer).

In some embodiments, the capping layer 506 includes a ruthenium (Ru) capping layer. In some embodiments, the Ru capping layer 506 has a thickness ranging from about 2.5 nm to about 3 nm. In some embodiments, the capping layer 506 includes a Si capping layer. In some embodiments, the Si capping layer has a thickness ranging from about 4 nm to about 4.5 nm. The thickness of the capping layer 506 helps to protect the multi-layer structure 504 (e.g., during fabrication of the photomask 250), and thus extending the useful life of the multi-layer structure 504. The capping layer 506 may also serve as an etch-stop layer for a subsequent absorber layer etch process. If the thickness of the capping layer 506 is too small, a useful life of the photomask 250 is reduced, in some instances. If the thickness of the capping layer 506 is too great, material is wasted without a significant increase in performance, in some instances.

In some embodiments, the absorbers 508 are configured to absorb EUV light (e.g., with a wavelength of about 13.5 nm). In some embodiments, the absorbers 508 may include for example, a $Ta_xN_y$ layer or a $Ta_xB_yO_zN_u$ layer. In some examples, other materials may be used for the absorbers 508, such as Al, Cr, Ta, and W, among others. In some embodiments, the absorbers 508 may have a thickness ranging from about 50 nm to about 75 nm. If the thickness of the absorbers 508 is too small, the absorbers 508 are not able to absorb a sufficient amount of EUV light, in some instances. If the thickness of the absorbers 508 is too great, the mask 3D effects become severe which results in unwanted feature-size dependent focus and pattern placement shifts, in some instances.

In some examples, the ARC layer 510 includes at least one of a $Ta_xB_yO_zNu$ layer, a $Hf_xO_y$ layer, or a $Si_xON_2$ layer or other suitable anti-reflective materials for the wavelength of the incident radiation.

While some examples of materials that may be used for each of the substrate 502, the backside coating layer 503, the multi-layer structure 504, the capping layer 506, the absorbers 508, and the ARC layer 510 have been given, it will be understood that other suitable materials as known in the art may be equally used without departing from the scope of the present disclosure.

For purposes of illustration, an exemplary fabrication method for the photomask 250 in FIG. 5 is herein described. In some embodiments, the fabrication process includes two process stages: (1) a mask blank fabrication process, and (2) a mask patterning process. During the mask blank fabrication process, the mask blank is formed by depositing suitable layers (e.g., reflective multiple layers such as Mo—Si multilayers) on a suitable substrate (e.g., an LTEM substrate having a flat, defect free surface). In various embodiments, the surface roughness of the mask blank is less than about 50 nm. By way of example, a capping layer (e.g., ruthenium) is formed over the multilayer coated substrate followed by deposition of an absorber layer. The mask blank may then be patterned (e.g., the absorber layer is patterned) to form a desired pattern on the photomask 250. In some embodiments, an ARC layer may be deposited over the absorber layer prior to patterning the mask blank. The photomask 250 may then be used to transfer circuit and/or device patterns onto a semiconductor wafer. In various embodiments, the patterns defined by the photomask 250 can be transferred over and over onto multiple wafers through various lithography processes. In addition, a set of photomasks (such as the photomask 250) may be used to construct a complete integrated circuit (IC) device and/or circuit.

In various embodiments, the photomask 250 (described above) may be fabricated to include different structure types such as, for example, a binary intensity mask (BIM) or a phase-shifting mask (PSM). An illustrative BIM includes opaque absorbing regions and reflective regions, where the BIM includes a pattern (e.g., and IC pattern) to be transferred to a semiconductor substrate. The opaque absorbing regions include an absorber, as described above, that is configured to absorb incident light (e.g., incident EUV light). In the reflective regions, the absorber has been removed (e.g., during the mask patterning process described above) and the incident light is reflected by the multi-layer. Additionally, in some embodiments, the photomask 250 may be a PSM which utilizes interference produced by phase differences of light reflected therefrom. Examples of PSMs include an alternating PSM (AltPSM), an attenuated PSM (AttPSM), and a chromeless PSM (cPSM). By way of example, an AltPSM may include phase shifters (of opposing phases) disposed on either side of each patterned mask feature. In some examples, an AttPSM may include an absorber layer having a transmittance greater than zero (e.g., Mo—Si having about a 6% intensity transmittance). In some cases, a cPSM may be described as a 100% transmission AltPSM, for example, because the cPSM does not include phase shifter material or chrome on the mask. In some illustrative embodiments of a PSM, the absorber 508 is reflective layer with a material stack similar to that of the multi-layer structure 504.

Figure 6:
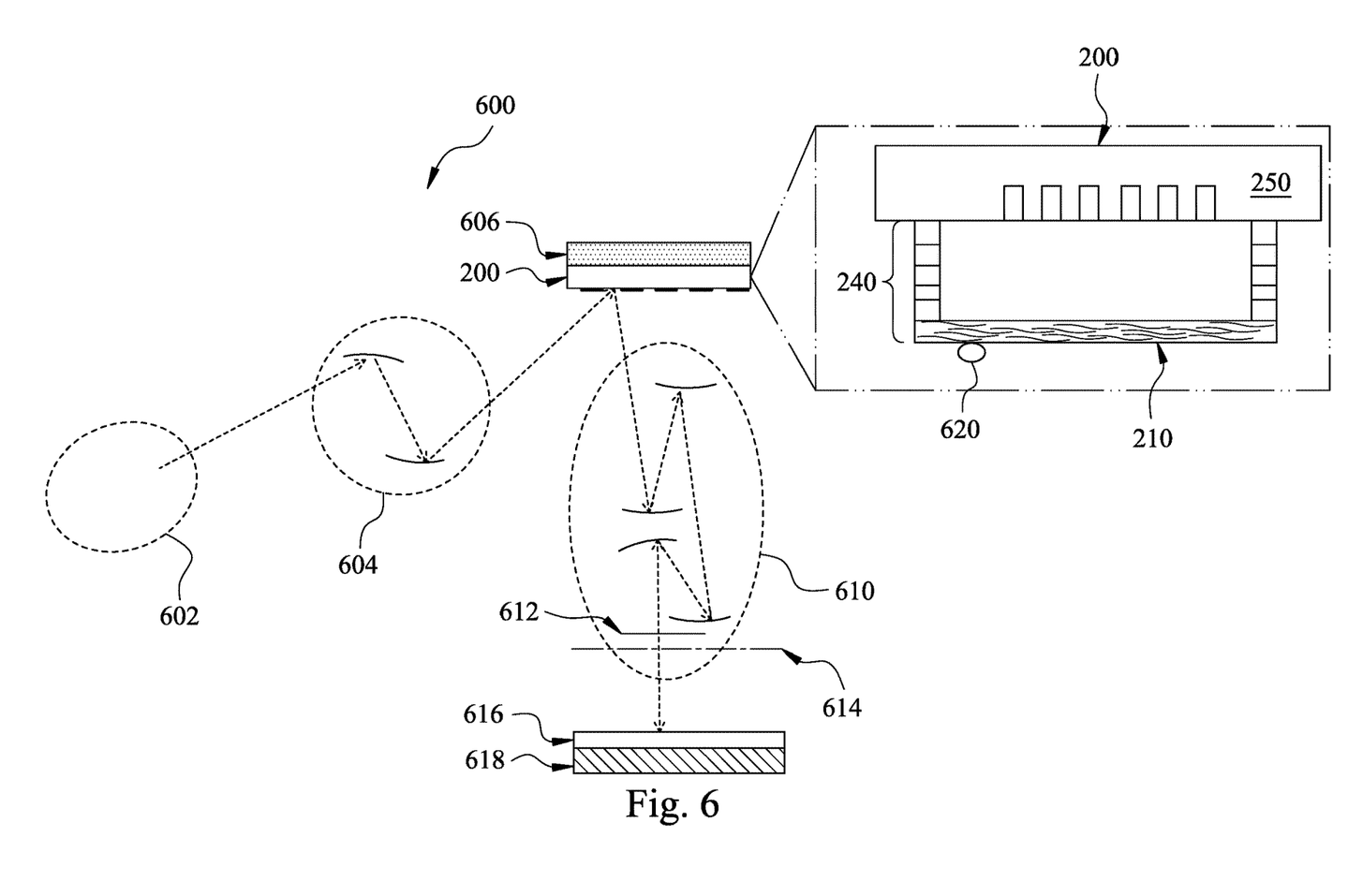
FIG. 6 is a schematic view of a lithography system, in accordance with some embodiments.

Illustrated in FIG. 6 is a schematic view of a lithography system 600, in accordance with some embodiments. The lithography system 600 may also be generically referred to as a scanner that is operable to perform lithographic processes including exposure with a respective radiation source and in a particular exposure mode. In at least some of the present embodiments, the lithography system 600 includes an ultraviolet (UV) lithography system designed to expose a resist layer with UV radiation, i.e., UV light. Inasmuch, in various embodiments, the resist layer includes a material sensitive to the UV light (e.g., a UV resist). The lithography system 600 of FIG. 6 includes a plurality of subsystems such as a radiation source 602, an illuminator 604, a mask stage 606 configured to receive a mask pellicle system 200 of the present disclosure, projection optics 610, and a substrate stage 618 configured to receive a semiconductor substrate 616. The following description of a UV photolithography system in accordance with embodiments of the present disclosure refers to EUV radiation as an example of ultraviolet radiation. Embodiments in accordance with the present disclosure are not limited to EUV lithography systems. In other words, embodiments described with reference to EUV systems include embodiments that utilize ultraviolet radiation. A general description of the operation of the lithography system 600 is as follows: EUV light from the radiation source 602 is directed toward the illuminator 604 (which includes a set of reflective mirrors) and projected is onto the reflective mask 608. A reflected mask image is directed toward the projection optics 610, which focuses the EUV light and projects the EUV light onto the semiconductor substrate 616 to expose a EUV resist layer deposited thereupon. Additionally, in various examples, each subsystem of the lithography system 600 may be housed in, and thus operate within, a high-vacuum environment, for example, to reduce atmospheric absorption of the EUV light.

In the embodiments described herein, the radiation source 602 may be used to generate the EUV light. In some embodiments, the radiation source 602 includes a plasma source, such as for example, a discharge produced plasma (DPP) or a laser produced plasma (LPP). In some examples, the EUV light may include light having a wavelength ranging from about 1 nm to about 100 nm. In one particular example, the radiation source 602 generates EUV light with a wavelength centered at about 13.5 nm. Accordingly, the radiation source 602 may also be referred to as a EUV radiation source 602. In some embodiments, the radiation source 602 also includes a collector, which may be used to collect EUV light generated from the plasma source and to direct the collected EUV light toward imaging optics such as the illuminator 604.

As described above, EUV light from the radiation source 602 is directed toward the illuminator 604. In some embodiments, the illuminator 604 may include reflective optics (e.g., for the EUV lithography system 600), such as a single mirror or a mirror system having multiple mirrors in order to direct light from the radiation source 602 onto the mask stage 606, and particularly to the mask pellicle system 200 secured on the mask stage 606. In some examples, the illuminator 604 may include a zone plate (not shown), for example, to improve focus of the EUV light. In some embodiments, the illuminator 604 may be configured to shape the EUV light passing there through in accordance with a particular pupil shape, and including for example, a dipole shape, a quadrapole shape, an annular shape, a single beam shape, a multiple beam shape, and/or a combination thereof. In some embodiments, the illuminator 604 is operable to configure the mirrors (i.e., of the illuminator 604) to provide a desired illumination to the photomask 250 in the mask pellicle system 200. In one example, the mirrors of the illuminator 604 are configurable to reflect EUV light to different illumination positions. In some embodiments, a stage (not shown) prior to the illuminator 604 may additionally include other configurable mirrors that may be used to direct the EUV light to different illumination positions within the mirrors of the illuminator 604. In some embodiments, the illuminator 604 is configured to provide an on-axis illumination (ONI) to the mask pellicle system 200.

In some embodiments, the illuminator 604 is configured to provide an off-axis illumination (OAI) to the mask pellicle system 200. It should be noted that the optics employed in the EUV lithography system 600, and in particular optics used for the illuminator 604 and the projection optics 610, may include mirrors having multilayer thin-film coatings known as Bragg reflectors. By way of example, such a multilayer thin-film coating may include alternating layers of Mo and Si, which provides for high reflectivity at EUV wavelengths (e.g., about 13 nm).

As discussed above, the lithography system 600 also includes the mask stage 606 configured to secure the mask pellicle system 200 within the lithography system 600. Since the lithography system 600 may be housed in, and thus operate within, a high-vacuum environment, the mask stage 606 may include an electrostatic chuck (e-chuck) to secure the mask pellicle system 200. As with the optics of the EUV lithography system 600, the photomask 250 is also reflective. As illustrated in FIG. 6, light is reflected from the photomask 250 and directed towards the projection optics 610, which collects the EUV light reflected from the photomask 250. By way of example, the EUV light collected by the projection optics 610 (reflected from the photomask 250) carries an image of the pattern defined by the photomask 250. In various embodiments, the projection optics 610 provides for imaging the pattern of the photomask 250 onto the semiconductor substrate 616 secured on the substrate stage 618 of the lithography system 600. In particular, in various embodiments, the projection optics 610 focuses the collected EUV light and projects the EUV light onto the semiconductor substrate 616 to expose a EUV resist layer deposited on the semiconductor substrate 616. As described above, the projection optics 610 may include reflective optics, as used in EUV lithography systems such as the lithography system 600. In some embodiments, the illuminator 604 and the projection optics 610 are collectively referred to as an optical module of the lithography system 600.

As discussed above, the lithography system 600 also includes the substrate stage 618 to secure the semiconductor substrate 616 to be patterned. In various embodiments, the semiconductor substrate 616 includes a semiconductor wafer, such as a silicon wafer, germanium wafer, silicon-germanium wafer, III-V wafer, or other type of wafer. The semiconductor substrate 616 may be coated with a resist layer (e.g., an EUV resist layer) sensitive to EUV light. EUV resists may have stringent performance standards. For purposes of illustration, an EUV resist may be designed to provide at least around 22 nm resolution, at least around 2 nm line-width roughness (LWR), and with a sensitivity of at least around 15 mJ/cm$^2$. In the embodiments described herein, the various subsystems of the lithography system 600, including those described above, are integrated and are operable to perform lithography exposing processes including EUV lithography processes. To be sure, the lithography system 600 may further include other modules or subsystems which may be integrated with (or be coupled to) one or more of the subsystems or components described herein.

The lithography system may include other components and may have other alternatives. In some embodiments, the lithography system 600 may include a pupil phase modulator 612 to modulate an optical phase of the EUV light directed from the photomask 250, such that the light has a phase distribution along a projection pupil plane 614. In some embodiments, the pupil phase modulator 612 includes a mechanism to tune the reflective mirrors of the projection optics 610 for phase modulation. For example, in some embodiments, the mirrors of the projection optics 610 are configurable to reflect the EUV light through the pupil phase modulator 612, thereby modulating the phase of the light through the projection optics 610. In some embodiments, the pupil phase modulator 612 utilizes a pupil filter placed on the projection pupil plane 614. By way of example, the pupil filter may be employed to filter out specific spatial frequency components of the EUV light reflected from the photomask 250. In some embodiments, the pupil filter may serve as a phase pupil filter that modulates the phase distribution of the light directed through the projection optics 610.

During the photolithography process, particles 620 are kept out of the focal plane of the photomask 250 by the pellicle membrane 210, a high fidelity pattern transfer from the photomask 250 to the semiconductor substrate 616 can be achieved.

One aspect of this description relates to a pellicle. The pellicle includes a pellicle membrane including at least one porous film. The at least one porous film includes a network of a plurality of nanotubes. At least one nanotube of the plurality of nanotubes includes a core nanotube and a shell nanotube surrounding the core nanotube, the core nanotube including a material different from the shell nanotube. The pellicle further includes a pellicle border attached to the pellicle membrane along a peripheral region of the pellicle membrane and a pellicle frame attached to the pellicle border.

Another aspect of this description relates to relates to a method for forming a mask pellicle system. The method includes forming a pellicle membrane including a porous film over a filter membrane. The porous film includes a network of a plurality of nanotubes. At least one nanotube of the plurality of nanotubes includes a core nanotube and a shell nanotube surrounding the core nanotube. The method further includes transferring the pellicle membrane from the filter membrane to a pellicle border, attaching the pellicle border to a pellicle frame, and mounting the pellicle frame onto a photomask comprising a pattern region.

Still another aspect of this description relates to a method for a lithography process. The method includes providing a pellicle including a pellicle membrane. The pellicle membrane includes at least one porous film formed of a network of a plurality of nanotubes. At least one nanotube of the plurality of nanotubes includes a core nanotube and a shell nanotube surrounding the core nanotube. The shell nanotube is composed of a boron-containing compound. The method further includes mounting the pellicle onto a photomask. The photomask includes a patterned surface. The method further includes loading the photomask having the pellicle mounted thereupon into a lithography system. The method further includes loading a semiconductor wafer onto a substrate stage of the lithography system. The method further includes performing a lithography exposure process to transfer a pattern of the patterned surface from the photomask to the semiconductor wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A pellicle, comprising:
a pellicle membrane including at least one porous film, the at least one porous film including a network of a plurality of nanotubes, at least one nanotube of the plurality of nanotubes including a core nanotube and a shell nanotube surrounding the core nanotube, wherein the core nanotube comprises a carbon nanotube or a bundle of a plurality of carbon nanotubes, and wherein the shell nanotube includes a compound selected from the group consisting of boron carbon nitride, silicon boron nitride and silicon boron carbide;
a pellicle border attached to the pellicle membrane along a peripheral region of the pellicle membrane; and
a pellicle frame attached to the pellicle border.

2. The pellicle of claim 1, wherein the carbon nanotube comprises a single wall carbon nanotube or a multiwall carbon nanotube.

3. The pellicle of claim 1, further comprising a frame adhesive between the pellicle border and the pellicle frame.

4. The pellicle of claim 1, wherein the pellicle membrane comprises a plurality of porous films stacked onto each other.

5. The pellicle of claim 1, wherein the pellicle membrane has a thickness ranging from 5 nm to 50 nm.

6. The pellicle of claim 1, wherein the plurality of nanotubes is arranged randomly within the at least one porous film.

7. The pellicle of claim 1, wherein the at least one porous film has a density ranging from 0.01 $g/cm^3$ to about 2 $g/cm^3$.

8. The pellicle of claim 1, wherein the core nanotube is encapsulated by the shell nanotube.

9. A method for forming a mask pellicle system, comprising:
forming a pellicle membrane including a porous film over a filter membrane, the porous film including a network of a plurality of nanotubes, at least one nanotube of the plurality of nanotubes including a core nanotube and a shell nanotube surrounding the core nanotube, wherein the core nanotube comprises a carbon nanotube or a bundle of a plurality of carbon nanotubes, and wherein the shell nanotube includes a compound selected from the group consisting of boron carbon nitride, silicon boron nitride and silicon boron carbide;
transferring the pellicle membrane from the filter membrane to a pellicle border;
attaching the pellicle border to a pellicle frame; and
mounting the pellicle frame onto a photomask comprising a pattern region.

10. The method of claim 9, wherein forming the pellicle membrane comprises:
forming a suspension comprising the plurality of nanotubes in a liquid medium;
applying the suspension to the filter membrane; and
applying vacuum to pull the liquid medium through the filter membrane, leaving the porous film on the filter membrane.

11. The method of claim 10, further comprising cleaning the porous film using a cleaning solvent.

12. The method of claim 10, wherein forming the pellicle membrane further comprises forming another porous film on the porous film to form a stack of porous films.

13. The method of claim 9, wherein transferring the pellicle membrane from the filter membrane to the pellicle border comprises:

attaching the pellicle border along a peripheral region of the pellicle membrane; and
removing the filter membrane.

14. The method of claim 13, wherein attaching the pellicle border along a peripheral region of the pellicle membrane comprises applying a force to the pellicle border and the pellicle membrane.

15. The method of claim 9, wherein forming the pellicle membrane further comprises forming the at least one nanotube of the plurality of nanotubes, forming the at least one nanotube comprising:

forming the core nanotube by plasma arc discharge, laser vaporization, ball-milling, laser ablation, or thermal plasma jet; and
coating the core nanotube by depositing the shell material using ion beam deposition, chemical vapor deposition (CVD), plasma enhanced chemical vapor deposition (PECVD), physical vapor deposition (PVD), or atomic layer deposition (ALD).

16. The method of claim 9, wherein forming the pellicle membrane further comprises forming the at least one nanotube of the plurality of nanotubes, forming the at least one nanotube comprising:

forming the shell nanotube by plasma arc discharge, laser vaporization, ball-milling, laser ablation or thermal plasma jet; and
growing the core nanotube inside the shell nanotube.

17. A method for a lithography process, comprising:
providing a pellicle including a pellicle membrane and a pellicle frame that secures the pellicle membrane across the pellicle frame, wherein the pellicle membrane includes at least one porous film formed of a network of a plurality of nanotubes, at least one nanotube of the plurality of nanotubes including a core nanotube and a shell nanotube surrounding the core nanotube, wherein the core nanotube comprises a carbon nanotube or a bundle of a plurality of carbon nanotubes, and wherein the shell nanotube is composed of a compound selected from the group consisting of boron carbon nitride, silicon boron nitride and silicon boron carbide;
mounting the pellicle onto a photomask, wherein the photomask includes a patterned surface;
loading the photomask having the pellicle mounted thereupon into a lithography system;
loading a semiconductor wafer onto a substrate stage of the lithography system; and
performing a lithography exposure process to transfer a pattern—of the patterned surface from the photomask to the semiconductor wafer.

18. The method of claim 17, wherein the photomask comprises:
a substrate;
a coating layer over a first side of the substrate;
a multi-layer structure over a second side of the substrate opposite the first side, the multi-layer structure including alternative layers of molybdenum and silicon;
a capping layer over the multi-layer structure; and
one or more absorbers over the capping layer.

19. The method of claim 17, further comprising forming the pellicle membrane from a suspension of nanotubes in a liquid medium.

20. The method of claim 19, wherein forming the pellicle membrane comprises:
applying the suspension to a filter membrane;
applying vacuum to pull the liquid medium through the filter membrane, leaving the nanotubes on the filter membrane; and
removing the filter membrane.

\* \* \* \* \*